United States Patent [19]
Sher et al.

[11] Patent Number: 4,603,258
[45] Date of Patent: Jul. 29, 1986

[54] PHOTOCAPACITIVE DETECTOR ARRAY

[75] Inventors: Arden Sher, Belmont; John B. Mooney, San Jose, both of Calif.

[73] Assignee: SRI International, Menlo Park, Calif.

[21] Appl. No.: 672,365

[22] Filed: Nov. 16, 1984

[51] Int. Cl.<sup>4</sup> ............................................. G01J 5/20
[52] U.S. Cl. .................................. 250/370; 250/332; 250/338; 357/30; 357/32
[58] Field of Search ................ 250/332, 338 SE, 349, 250/350, 370 R, 370 G, 370 H, 370 K; 357/30 R, 32

[56] References Cited

U.S. PATENT DOCUMENTS

| | | | |
|---|---|---|---|
| 4,011,441 | 3/1977 | Michon et al. | 235/193 |
| 4,011,442 | 3/1977 | Engeler | 235/193 |
| 4,012,767 | 3/1977 | Brown et al. | 357/71 |
| 4,024,562 | 5/1977 | Brown et al. | 357/23 |
| 4,081,794 | 3/1978 | Parks et al. | 365/118 |
| 4,152,597 | 5/1979 | Sher | 250/370 |
| 4,190,851 | 2/1980 | Finnila et al. | 357/30 |
| 4,190,852 | 2/1980 | Warner, Jr. | 357/30 |
| 4,197,469 | 4/1980 | Cheung | 307/221 D |
| 4,214,253 | 7/1980 | Hall | 397/29 |
| 4,227,942 | 10/1980 | Hall | 136/255 |
| 4,331,873 | 5/1982 | Miller et al. | 250/330 |
| 4,503,447 | 3/1985 | Iafrate et al. | 357/16 |

OTHER PUBLICATIONS

A. Sher, Y. H. Tsuo, J. A. Moriarty, W. E. Miller and R. K. Crouch, "Si and GaAs Photocapacitive MIS Infrared Detectors", *J. Appl. Phys.*, vol. 51, No. 4 (Apr. 1980) pp. 2137-2148.

A. Sher, R. K. Crouch, S. S.-M. Lu, W. E. Miller and J. A. Moriarty, "Photocapacitive MIS Infrared Detectors", *Appl. Phys. Lett.*, vol. 32, No. 11 (Jun. 1978) pp. 713-715.

W. G. Pfann, "Temperature Zone Melting", *Transactions AIME, Journal of Metals* (Sep. 1955) pp. 961-964.

William G. Pfann, *Zone Melting*, "Temperature-Gradient Zone Melting", Chapter 10, 2nd Edition, John Wiley & Sons, Inc. (1958, 1966) pp. 254-268.

Primary Examiner—Craig E. Church
Assistant Examiner—Constantine Hannaher
Attorney, Agent, or Firm—Lowe, Price, Leblanc, Becker & Shur

[57] ABSTRACT

A photocapacitive image detector array comprises a matrix of $M \times N$ spaced columns of relatively high carrier concentration extending between first and second opposite faces of a semiconductor substrate having a relatively low carrier concentration. N parallel spaced electrode stripes extend in the X direction on the first face and M parallel spaced semiconductor stripes of intermediate carrier concentration extend in the Y direction on the second face. Stripe k of the N stripes makes ohmic contacts with each of the M columns, where $k = 1, 2, \ldots N$. Stripe p of the M semiconductor stripes makes contact with each of the N columns, where $p = 1, 2, \ldots M$. Each of the M regions has a depletion layer having a thickness adapted to be modulated by radiation from an image to be detected. M parallel spaced electrode stripes extend in the Y direction so that stripe q of electrode stripes M is in registration with semiconductor stripe q, where $q = 1, 2, \ldots M$. A composite insulating layer, including two insulating thin films, is sandwiched between the M electrode stripes and M semiconductor stripes. Thereby $M \times N$ pixels are formed, with each pixel being associated with a different one of the columns. The composite insulating layer and M electrodes are transparent to radiation from the image so that the image incident on the semiconductor stripes modulates the thickness of the depletion layers of the semiconductor stripes to vary the capacitance at each pixel as a function of the radiation intensity incident thereon.

28 Claims, 4 Drawing Figures

PHOTOCAPACITIVE DETECTOR ARRAY

TECHNICAL FIELD

The present invention relates generally to photocapacitive detector arrays and more particularly to a photocapacitive detector array including separate metal insulating semiconductor (MIS) capacitors formed on a face of a relatively low carrier concentration semiconductor substrate wherein the semiconductor of each capacitor is connected to an electrode on an opposite face of the substrate by a separate doped high carrier concentration region extending through the substrate between the faces.

BACKGROUND ART

In Sher, U.S. Pat. No. 4,152,597, there is disclosed an MIS photocapacitive detector including a superionic relatively thin electrical insulating layer (preferably lanthanum trifluoride) that is formed on one face of an intrinsic semiconductor. An opposite face of the intrinsic semiconductor is connected to an electrode. A second electrode is formed on the superionic electrically insulating layer. The second electrode and superionic insulating layer are transparent to optical energy that is cyclically modulated and which is incident on the intrinsic semiconductor. The image incident on the intrinsic semiconductor has wavelengths with photon energy greater than the band gap of the intrinsic semiconductor to modulate the thickness of a depletion layer in the semiconductor. Thereby, the capacitance between the electrodes is modulated.

In Miller et al, U.S. Pat. No. 4,331,873, there is disclosed a photocapacitive image converter employing some of the principles involved in the Sher photocapacitive detector. In the Miller et al converter, a back face of a semiconductor substrate is completely covered by an electrode making ohmic contact with the substrate. On the opposite, front face of the substrate is deposited an epitaxial layer of a semi-intrinsic semiconductor, i.e., a semiconductor having a low amount of dopant and a low carrier concentration. The epitaxial layer is covered by a composite insulator formed of a thin film of silicon dioxide, in turn covered by a thin film of the superionic insulator. On the insulator is a first set of plural, spaced stripe electrodes extending in an X direction of a Cartesian coordinate system. The first electrodes are covered by a composite insulator, similar to the one covering the epitaxial layer. On the second composite insulator is a second set of plural separate stripe electrodes extending in the Y direction. The electrodes, insulating layers and epitaxial layer are transparent so that the thickness of a depletion layer in the semiconductor substrate is modulated by the image. In an attempt to minimize cross talk between the separate electrode stripes, and minimize the separation between adjacent stripes while providing a large number of stripes per unit area, a doped region is implanted in the epitaxial semiconductor layer in gaps between the stripes extending in the X direction and the stripes extending in the Y direction.

The converter is sealed in an appropriate component package having a transparent window over the front face of the substrate to allow light to be incident thereon. The package is pressurized with an inert gas to prevent fogging and corrosion.

Each of the electrode stripes extending in the Y direction is connected to one terminal of a multifrequency AC source, such that a different frequency is applied to each of the stripes extending in the Y direction. Each of the stripes extending in the X direction is connected to one terminal of a separate spectrum analyzing circuit. The remaining, usually ground terminals of the AC sources and spectrum analyzers are connected to the electrode on the back face of the detector array. The optical image incident on the semiconductor substrate is cyclically modulated.

There is thus formed a pixel at each intersection where the X and Y extending electrode stripes are in registration. In response to the frequency of the AC source coupled to each pixel and the image variations incident on each pixel, there is a voltage coupled to a processing circuit connected to each X electrode stripe. The voltage supplied to each processing circuit has an amplititude indicative of the light intensity on each pixel coupled to the X stripe. The frequency coupled by each pixel to the X stripe corresponding with the pixel is equal to the frequency of the AC source exciting the pixel as changed by the image frequency. The processing circuits separate the different frequency components of the plural pixels coupled to the same X stripe to enable the image to be reconstituted.

The prior art device described in the Miller et al patent has relatively low sensitivity and is susceptible to cross talk between the signals coupled to the output electrode stripes. The device of the Miller et al patent has relatively low sensitivity because the capacitance variation of each pixel coupled to an X output stripe is only a small percentage of the total capacitance coupled to the X output stripe. The total capacitance coupled to each output stripe subsists between one of the X output stripes and the grounded electrode covering the back face of the substrate. The signal coupled to a processing circuit from a single pixel is significantly attenuated by a factor equal to the relatively small ratio of the area of a single pixel to the area of the X electrode output stripe coupled to the pixel.

We have experimentally found that appreciable cross talk also subsists between the pixels associated with the adjacent electrode stripes. The attempt to prevent such cross talk by use of ion implanted heavily doped regions which form a grid of channel stops in the gaps between the stripes extending in the X and Y directions (as discussed in the Miller et al patent) does not provide adequate separation for very closely spaced stripe electrodes.

It is, accordingly, an object of the present invention to provide a new and improved photocapacitive detector.

Another object of the invention is to provide a new and improved photocapacitive detector array having improved sensitivity.

A further object of the invention is to provide a new and improved photocapacitive detector array having low cross talk between pixels formed between adjacent electrode stripes.

Still another object of the present invention is to provide a new and improved photocapacitive detector array having high sensitivity, low cross talk, and high density elements which result in high resolution.

DISCLOSURE OF THE INVENTION

In accordance with one aspect of the present invention, a photocapacitive image detector array comprises a semiconductor substrate with a relatively low carrier concentration. N mutually spaced parallel stripe electrodes extend in a first direction on one face of the substrate. M mutually spaced parallel stripe semiconductor regions of intermediate carrier concentration extend in a second direction along a second face of the substrate. Each of the M regions has a depletion layer having a thickness adapted to be modulated by radiation from an image to be detected. Insulating layer means covers the M semiconductor stripe regions and separate adjacent ones of the semiconductor stripe regions from each other. M mutually spaced parallel stripe electrodes extend in the second direction so that electrode k of the M electrodes overlays the insulating layer means covering semiconductor stripe region k, where k = 1, 2 ... M, and M and N are integers, at least one of which is greater than one (1). The insulating layer means and M electrodes are transparent to radiation from the image so that the image is incident on the M semiconductor stripes. Plural high carrier concentration doped regions extend through the substrate between the first and second opposite faces. Each of the doped regions forms an ohmic contact with one of the N parallel stripes and contacts one of the M semiconductor regions so that an electric connection subsists from one of the electrodes through one of the doped regions to one of the M stripes. Photocapacitive pixels are thus formed by the N electrodes making ohmic contact with the plural doped regions that contact the semiconductor stripe regions which are covered by the insulating layer means, in turn overlayed by the M electrodes.

Sensitivity is enhanced by the stated construction because the semiconductor depletion layer that is modulated by radiation from the image subsists between the M and N electrodes. Thus, each of the M×N pixels has a truly separate capacitor associated with it even though an electrode for that capacitor is common to several capacitors. Cross talk is virtually eliminated because of the separate nature of the capacitors in the array.

Cross talk is further reduced by spacing adjacent semiconductor stripe regions from each other; the spacing is provided by grooves formed by the insulating means. The grooves extend into the second face of the substrate, between adjacent ones of the doped regions. Cross talk is still further reduced because a junction subsists between each doped region and the substrate. Each junction forms a barrier to prevent current in the doped region from penetrating into the substrate. Cross talk is also reduced by forming a separate junction between each of the N electrodes and the substrate, by virtue of judicious choice of the electrode metal and the substrate semiconductor.

In accordance with a further aspect of the invention, a photocapacitive image detector array comprises a semiconductor substrate having a relatively low carrier concentration. Relatively high carrier concentration spaced doped columns arranged in an M×N matrix extend through the substrate between first and second opposite faces thereof. N parallel spaced electrode stripes extend in the X direction on the first face, with stripe k of the N stripes making ohmic contact with each of columns 1, 2 ... M, where k = 1, 2 ... N. M parallel spaced semiconductor stripe regions of intermediate carrier concentration extend in the Y direction on the second face, so that stripe p of the M semiconductor stripes makes contact with each of columns 1, 2 ... N, where p = 1, 2 ... M. Each of the M regions has a depletion layer having a thickness adapted to be modulated by radiation from the image to be detected. M parallel spaced electrode stripes extend in the Y direction so that stripe q of electrode stripes M is in registration with semiconductor stripe q, where q = 1, 2 ... M, where N and M are integers greater than 1. Insulating layer means are sandwiched between the M electrode stripes and the M semiconductor stripes. The insulating layer means and M electrodes are transparent to radiation from the image so that the image is incident on the semiconductor stripes to modulate the thickness of the depletion layers of the semiconductor stripes. Thereby, M×N pixels are formed, with each pixel being associated with a different one of the doped columns.

In accordance with an additional aspect of the invention, an improved photocapacitor detector comprises a semiconductor substrate having a relatively low carrier concentration. A doped column of relatively high carrier concentration extends through the substrate between first and second opposite faces of the substrate. A first electrode on the first face makes ohmic contact with the doped column. A semiconductor layer of intermediate carrier concentration on the second surface contacts the column. The semiconductor layer has a depletion layer having a thickness adapted to be modulated by radiation to be detected. Insulator layer means overlays the semiconductor layer. A second electrode overlays the insulator layer means in registration with the column and semiconductor layer. The insulating layer means and second electrode are transparent to radiation to be detected so that the radiation to be detected is incident on the semiconductor layer to modulate the thickness of the stripe depletion layer.

The resulting photocapacitive device connects an electric excitation source means to an electric load means. A first terminal of one of the electric means is connected to the first electrode while a first terminal of the other electric means is connected to the second electrode. Second, generally ground terminals of these electric means are connected together directly, without going through the intermediary of the detector device. The electric excitation source can be plural frequencies simultaneously connected to plural stripes extending in one direction to provide a plurality of the first electrodes; alternatively the electric excitation source can be a single AC source sequentially connected to these stripes. The electric load means can be plural spectrum analyzers simultaneously connected to plural stripes extending in a second direction to provide a plurality of the second electrodes; alternatively the load can be plural devices sequentially connected to the second electrode stripes.

The above and still further objects, features and advantages of the present invention will become apparent upon consideration of the following detailed description of several specific embodiments thereof, especially when taken in conjunction with the accompanying drawings.

DETAILED DESCRIPTION OF THE PREFERRED EMBODIMENT

Figure 1:
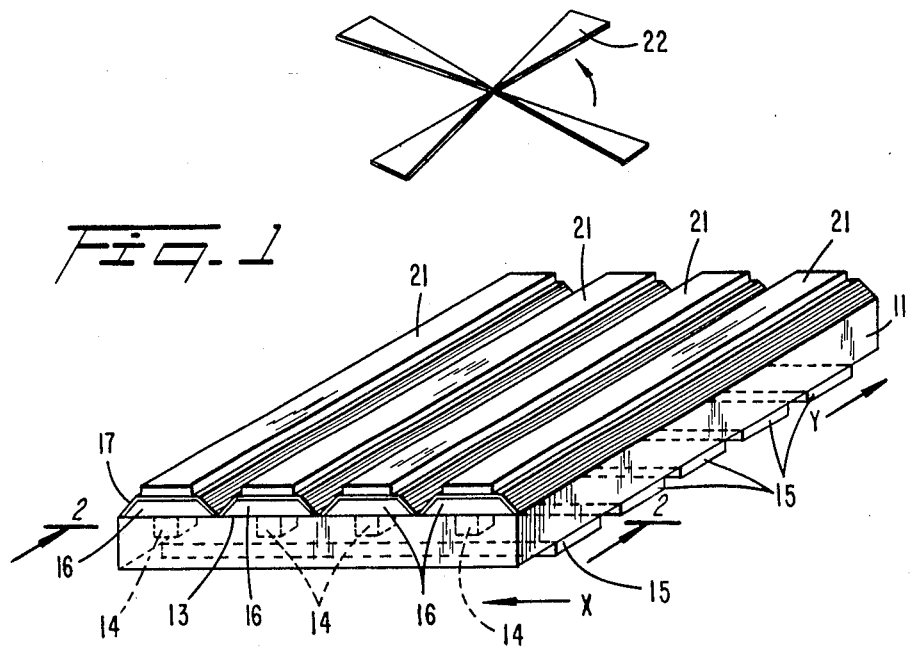
FIG. 1 is a perspective view of an exemplary photocapacitive detector imaging array in accordance with a preferred embodiment of the invention.
Figure 2:
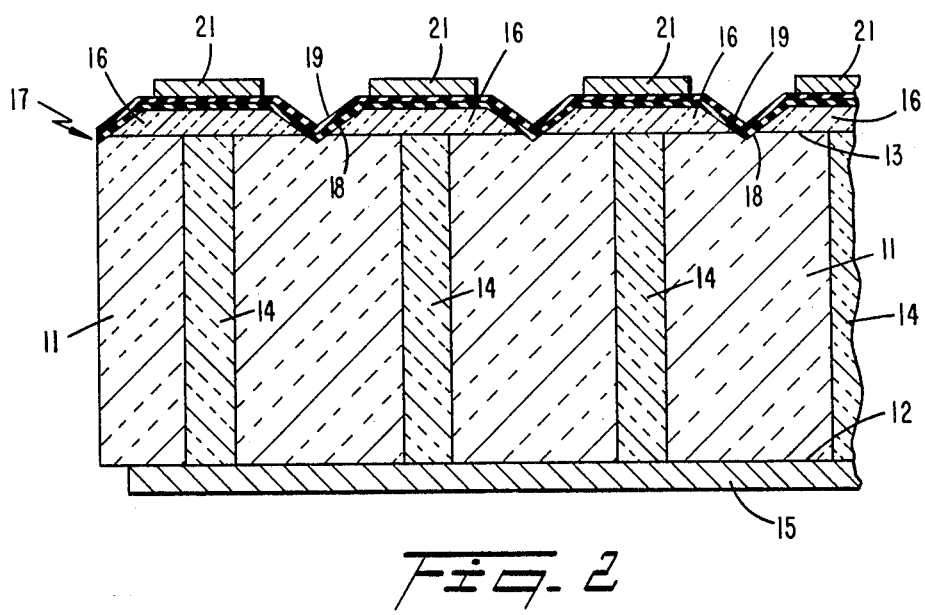
FIG. 2 is a partial side sectional view of the device illustrated in FIG. 1, taken through the lines 2—2.
Figure 3:
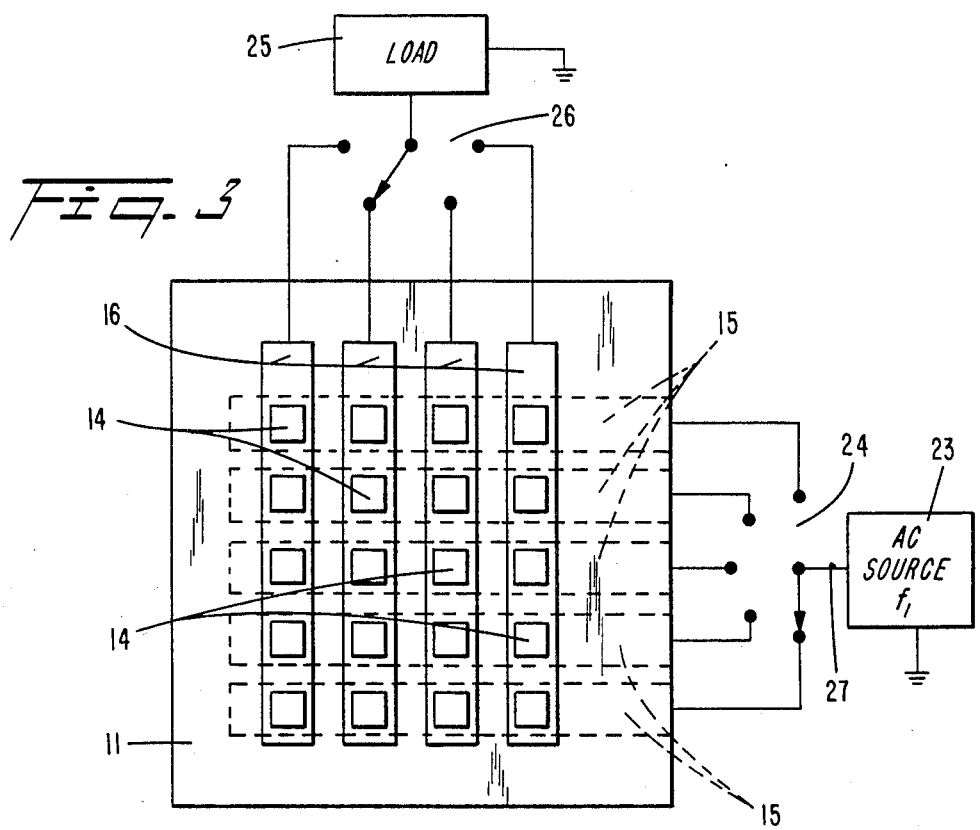
FIG. 3 is a top view of the device illustrated in FIGS. 1 and 2, with exemplary connections for a single AC source and plural loads, each sequentially connected to a different electrode stripe.

Reference is now made to FIGS. 1-3 of the drawing wherein a photocapacitive image detector array in accordance with the invention is illustrated as including a bulk n-type substrate 11, preferably fabricated of silicon and having a relatively low carrier concentration so that the substrate has a bulk resistivity on the order of at least 100 ohm-centimeters. Substrate 11 includes two opposite substantially planar faces 12 and 13 between which extend twenty doped semiconductor regions formed as columns 14. Faces 12 and 13 are respectively considered the bottom and top faces of the array, i.e., the faces that are not exposed and are exposed to radiation from the source of interest. Columns 14 are laid out in a rectangular 5×4 matrix, such that each column has a square cross section and substantially the same area. In the preferred embodiment, columns 14 are p+doped aluminum columns.

Columns 14 are fabricated by using the thermal gradient zone melting technique described by W. G. Pfann in the *Transactions of the American Institute of Metalurgical Engineers,* Volume 203, page 961 (1955) and in the book entitled, *Zone Melting,* Second Edition, Wiley and Sons, New York (1963). In the thermal gradient zone melting method columns 14 are formed by depositing aluminum on a face of an oriented silicon wafer having the known desired bulk and resistivity characteristics. The aluminum is deposited in the regions where columns 14 are to be located.

In the device illustrated in the Figures, aluminum is deposited on face 12 of substrate 11 in square patterns. Substrate 11 is arranged so that a selected crystal axis thereof extends between faces 12 and 13. Heat is applied to face 12 and an appropriate thermal gradient is provided between faces 12 and 13. Typically, the thermal gradient is 100 degrees Centigrade per centimeter between faces 12 and 13, with face 12 maintained at a temperature of 1000 degrees Centigrade. These conditions cause aluminum deposited on face 12 to dissolve the silicon between faces 12 and 13 in alignment with the initially deposited aluminum. The molten aluminum linearly dissolves the silicon between faces 12 and 13 until the aluminum becomes saturated with silicon. The crystalline silicon is deposited on the cold or staring side in the crystal orientation of the surrounding silicon but is degenerately doped P++ with aluminum. The process proceeds so the leading edge of the aluminum zone reaches the hot surface of face 13, causing columns 14 of aluminum doped silicon to be grown where originally silicon doped areas of P+ aluminum are provided on and between faces 12 and 13, as illustrated in the matrix arrangement of FIG. 3.

A junction subsists between each relatively high concentration P+ aluminum doped silicon column 14 and the surrounding bulk n-type silicon substrate 11. The junction between column 14 and substrate 11 helps to prevent the spread of current flowing through columns 14 into substrate 11 because the junction forms a barrier to the flow of current from the columns into the substrate.

While a 5×4 matrix is illustrated for columns 14, it is to be understood that columns 14 can be arranged in any matrix arrangement such that, in the general situation, the matrix is N×M, where N and M are integers, with at least one of N and M being greater than 1; in the present example N=5, M=4. N and M can be equal or different, although in most situations they are equal; typically, each of N and M has a value of at least 100, to provide a high resolution device.

Formed on bottom face 12 are five (N) parallel elongated spaced metal stripe electrodes 15 which extend in an X axis direction. The position, spacing, width, and length of electrode stripes 15 are such that electrode stripe k intersects and is connected to each of the four (M) columns of row k in the matrix forming columns 14, where k is 1, 2 . . . 5; in the generalized case, k=1, 2 . . . N. The metal forming electrodes 15 is selected so that there is ohmic contact between each of the electrode stripes and the columns, and a barrier junction between each of the stripes and the remainder of the bulk n-type silicon in substrate 11 contacting the stripes; aluminum is a suitable choice for electrodes 15. Thereby, a low impedance current path is provided between electrodes 15 and columns 14, but a higher impedance subsists between electrodes 15 and the remainder of substrate 11. Current thus flows easily between electrodes 15 and columns 14, but current flow is to a large extent inhibited between electrodes 15 and the bulk, lightly doped, relatively high resistivity substrate 11.

Formed on top face 13 are four (M) parallel spaced semiconductor elongated stripes 16 which extend in the Y axis direction at right angles to the X axis electrode stripes 15. Each of stripes 16 is a P doped silicon region, having a doping concentration between that of columns 14 and substrate 11. Thus, as claimed herein, regions 16 are defined as being of intermediate concentration, although they would, by usual definition, be considered as lightly doped. Each of semiconductor stripes 16 is positioned and has a size such that semiconductor stripe q covers and contacts all five (N) aligned columns 14 that extend in the X direction, where q=1, 2 . . . 4(M). Semiconductor regions 16 form separate junctions at each contact area with one of columns 14, as well as the contact areas with substrate 11. The barrier of the junction between stripes 16 and columns 14 is relatively low so that current flows relatively easily between regions 14 and 16.

Regions 16 include a depletion layer having a thickness that is modulated by the light from an image which is incident on face 13. Radiation in the light imaged on face 13 has a wavelength with photon energy greater than the band gap of doped silicon stripes 16. Thereby, as the amplitude of the radiation incident on different regions of stripes 16 changes, there is a corresponding change in the thickness of the depletion layer at these regions, so that the capacitance between opposite faces of each region of each of stripes 16 changes as the amplitude of the radiation incident thereon changes. At each region P where stripes 15 and 16 are in registration, which coincides with the area of one of columns 14, an MIS variable capacitor pixel is formed. The capacitance of each pixel is modulated by the intensity of the radiation incident on the pixel, by virtue of the radiation varying the depletion layer thickness of stripe 16 at the pixel.

To assist in electrically and mechanically separating adjacent ones of stripes 16, each of the stripes 16 is formed as a trapezoid in cross-section as viewed in FIG. 2. The trapezoid has sloping sides extending inwardly toward the center of each region 16 as the height of the regions increases from face 13, where the bases of the trapezoids are located. The sloping sides of the trapezoidal cross-sections of adjacent stripes 16 intersect face 13 at different points on the face to provide a gap and separation between adjacent stripes 16. Electrical and mechanical separation between adjacent stripes 16 is provided by forming a groove in face 13 of substrate 11 between adjacent semiconductor stripes 16.

Deposited in each of the grooves and covering the top and sloping sides of stripes 16 is an insulation layer means 17. Insulating layer means 17 is a composite insulator including two insulating thin films 18 and 19. In particular, insulating layer means 17 includes a first insulating layer 18, preferably formed of silicon dioxide ($SiO_2$) having a thickness on the order of 240 Angstroms. Silicon dioxide layer 18 is covered by a superionic insulating conductor film 19. In the preferred embodiment, film 19 is formed of lanthanum trifluoride having a thickness of 250 Angstroms. The composite insulating layer means 17, including thin film layers 18 and 19, is employed because such a configuration provides maximum dielectric with minimum leakage current and minimum thickness. Layers 18 and 19 typically have thicknesses of approximately 240 Angstroms because such a thickness provides the desired optical capabilities, while preventing pinholing. A composite insulating layer is employed to assure integrity of the insulator. Lanthanum trifluoride is preferably employed for layer 19 because it is a superionic conductor, i.e., a dielectric having a resistivity of less than $10^7$ ohm centimeters at approximately room temperature. It is to be understood that other superionic conductors can be employed as long as they form a blocking contact, as discussed in Sher, U.S. Pat. No. 4,152,597.

Formed on insulating layer means 17 are four (M) electrode stripes 21, each of which is in registration with a different one of semiconductor stripes 16. Each of stripes 21 is electrically insulated from silicon regions 16 by the composite insulating layer means 17 including thin films 18 and 19. Electrode stripes 21 are elongated and have an extent in the Y direction approximately equal to the Y direction extent of semiconductor regions 16.

Electrode stripes 21 are fabricated of a material and are sufficiently thin to be transparent to radiant energy in the infrared to x-ray region which is focused on the detector array of FIGS. 1-3. Similarly, layers 18 and 19 are both sufficiently thin to be transparent to the optical energy, whereby the optical energy penetrates into silicon stripes 16, to modulate the thickness of the depletion layers of stripes 16. Preferably, stripes 16 have a thickness of approximately 5 micrometers. Typically, the depletion layer in stripes 16 has a thickness, i.e., extent between face 13 and layer 18 in the axial direction of columns 14, of two micrometers. If stripes 16 were thinner than two micrometers, it is likely that the depletion layer would punch through in response to the optical energy incident on stripes 16. Punch through of the depletion region must be avoided because there cannot be proper readout of the image intensity at the region where the punch through occurs. If regions 16 were to have a thickness much greater than 5 micrometers, the high frequency response of the array would be considerably reduced, whereby the array would be incapable of reproducing optical images having a tendency to change quickly. This is because thick semiconductor regions 16 have relatively large resistances, which would be in series with the dielectric of layers 18 and 19 to provide a device having a large resistance-capacitance time constant, and a resulting low frequency cut-off.

Typically, semiconductor stripes 16 have a carrier concentration of $2.5 \times 10^{14}$ carriers per cubic centimeter, in contrast to the carrier concentration of columns 14 that is typically on the order of $10^{19}$ carriers per cubic centimeter. A depletion layer is formed in stripes 16 when no external bias is applied to the device by proper selection of metals for stripe electrodes 15 and 21. For the stated semiconductors and insulators electrodes 15 and 21 are preferably aluminum. The optical image incident on semiconductor stripes 16 and which modulates the thickness of the depletion region of each of stripes 16 is appropriately focused by a lens (not shown) and cyclically modulated by mechanical chopper 22 that is driven to rotate at constant speed by an appropriate motor (not shown). Chopping of the image is important to enable the device to be of an AC nature, to remove a possible problem of drift and other problems associated with DC operations.

The chopped radiation incident on each pixel varies the capacitance of that pixel. Because the varying capacitance of each pixel is between the electrodes of that pixel, the device has a sensitivity commensurate with the area of each pixel, rather than the area of each pixel divided by the length of a stripe to which the pixel is connected. This provides enhanced sensitivity.

The enhanced sensitivity is provided, in one embodiment, with a switching arrangement wherein AC source 23, FIG. 3, is sequentially connected to each of electrodes 15 by switch 24. Each of AC source 23 and load 25 includes a second, common ground terminal. The ground terminals of source 23 and load 25 are connected to each other and are not connected to the detector array.

Each of electrodes 21 is sequentially connected to load 25 by switch 26. In particular, terminal 27 of AC source 23 is sequentially connected by switch 24 to electrodes 15 while terminal 28 of load 25 is sequentially connected by switch 26 to each of electrodes 21. While switch 24 dwells on a single switch location associated with a single one of electrode stripes 15, switch 26 is cycled to be connected sequentially to each of electrode stripes 21. Thereby, load 25 is sequentially provided with information of intensity of the radiation incident on the pixels in the row of the matrix of columns 14 that is energized by AC source 23. Because current can flow through only one of the 20 ($M \times N$) pixels at a time with such a sequencing arrangement, sensitivity is enhanced. Load 25 preferably includes a spectrum analyzer for determining the amplitude of Fourier components coupled thereto. The amplitudes of the Fourier components indicate the amplitudes of the different frequency components of the image incident on the array.

Figure 4:
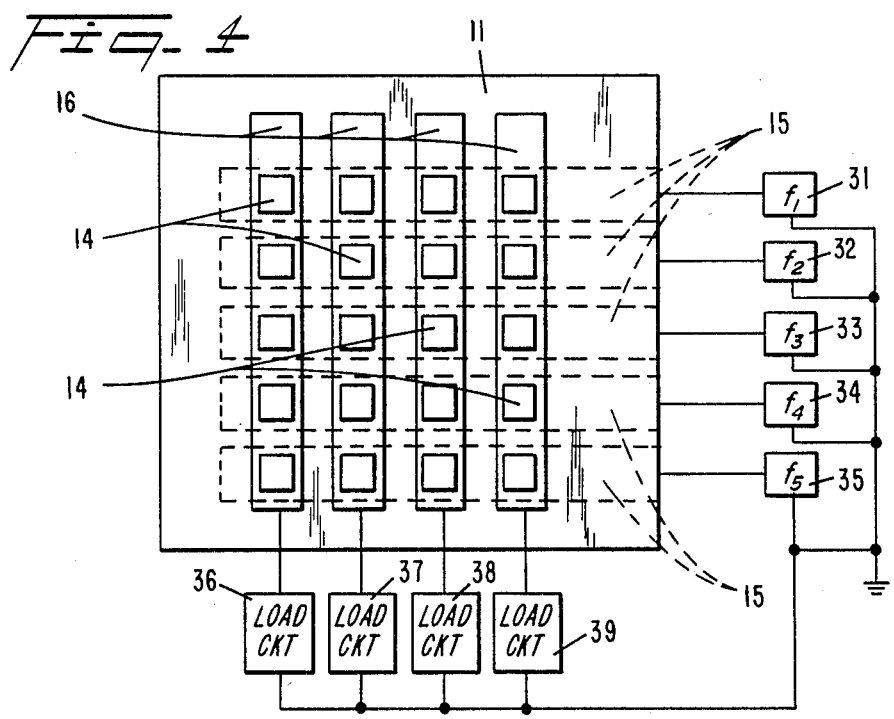
FIG. 4 is a top view of the device with the different electrode stripes being simultaneously connected to AC sources of different frequencies and to load circuits with different spectrum analyzers.

In a second embodiment, as illustrated in FIG. 4, AC source 23 is replaced by five (N) AC sources 31-35, simultaneously connected to the five electrode stripes 15, respectively. AC sources 31-35 respectively derive frequencies of $f_1$, $f_2$, $f_3$, $f_4$, and $f_5$. Thus, each of electrode stripes 15 has a certain identifiable frequency associated with it. Simultaneously connected to each of electrode stripes 21 is a separate one of four (M) load circuits 36, 37, 38 and 39. Each of load circuits 36-39 includes a spectrum analyzer for deriving a signal having a magnitude corresponding with the frequencies of sources 31-35, as shifted by the radiation incident on each pixel. The signals coupled to load circuits 36-39 amplitude modulate the frequencies $f_1$-$f_5$; the amplitude and frequency of the amplitude modulation is determined by the amplitude and frequency of the radiant energy incident on each pixel.

Each of load circuits 36–39 includes a spectrum analyzer for separating the signal coupled thereto into identifiable Fourier components associated with frequencies $f_1$-$f_5$. The frequency of the radiant energy incident on each pixel is separated by determining the load circuit to which the signal is coupled, as well as the frequency shift from the values of $f_1$-$f_5$; the amplitude of the component at the shifted frequency is determined to detect intensity for each pixel.

Each of sources 31–35 and load circuits 36–39 includes a ground terminal that is not connected to the photocapacitive detector array of FIG. 4. Instead, the ground terminals of circuits 31–39 are connected to each other and to a common ground. The sensitivity of the device illustrated in FIG. 4 is relatively high compared to the prior art, although it is not as high as the sensitivity of the device illustrated in FIG. 3. In particular, the reduction in signal from a given pixel is the ratio of the area of the given pixel to the area of all of the pixels coupled to the electrode 21 of that same pixel. Thus, the reduction is 1/N, i.e., the reciprical of the number of AC sources connected to the electrode stripes exciting the pixels connected to the frequency sources; in the specific embodiment, the reduction is one over five. In the prior art device of U.S. Pat. No. 4,331,873 the sensitivity is decreased by the ratio of the pixel area to the area of both stripes included in the pixel. This is because of the capacitive coupling to ground through the modulated depletion thickness of the entire substrate.

While there have been described and illustrated several specific embodiments of the invention, it will be clear that variations in the details of the embodiments specifically illustrated and described may be made without departing from the true spirit and scope of the invention as defined in the appended claims. For example, single crystal bulk, n-type silicon substrate 11 can be replaced by single crystal bulk germanium or gallium arsenide. Such devices would have a homojunction between the bulk substrate and the semiconductor stripes which are modulated in depletion thickness by the incident radiating energy, similar to stripes 16. In addition, heterojunctions can be formed between single crystal substrates and the modulated semiconductor regions similar to stripes 16. Such heterojunctions can be formed by silicon crystal substrates on which are formed active, modulated depletion thickness regions, similar to stripes 16; such modulated depletion thickness regions can be, e.g., formed of $Hg_xCd_{(1-x)}Te$, $Pb_xSn_{(1-x)}Te$, $Pb_xCd_{(1-x)}S$, $PbS_xSe_{(1-x)}$, $PbS_xTe_{(1-x)}$ or $PbSe_xTe_{(1-x)}$, where $0 < x < 0.5$.

We claim:

1. A photocapacitive image detector array comprising a semiconductor substrate having a relatively low carrier concentration as well as opposite first and second faces, N mutually spaced parallel stripe electrodes extending in a first direction along said first face of the substrate, M mutually spaced parallel stripe semiconductor regions of intermediate carrier concentration extending in a second direction along said second face of the substrate, each of the M regions including a depletion layer having a thickness adapted to be modulated by an image to be detected, the first and second directions differing from each other, the insulating layer means covering the M semiconductor stripe regions and separating adjacent ones of the semiconductor stripe regions from each other, M mutually spaced parallel stripe electrodes extending in the second direction so that the electrode k of the M electrodes overlays the insulating layer means covering semiconductor stripe region k, where k = 1,2 ... M, the insulating layer means and M electrodes being transparent to radiation from the image so that the image is incident on the M semiconductor stripes, plural high carrier concentration doped regions extending through the substrate between the first and second faces, each of said doped regions forming an ohmic contact with one of said N parallel stripe electrodes and contacting one of the M semiconductor regions so that an electric connection subsists from one of the N electrodes through one of the doped regions to one of the M stripes and photocapacitive pixels are formed by the N electrodes making contact with the plural doped regions contacting the semiconductor stripe regions which are covered by the insulating layer means which in turn are overlaid by the M electrodes.

2. The apparatus of claim 1 wherein M×N of the doped regions are provided to form M×N pixels.

3. The apparatus of claim 1 wherein the substrate is a lightly doped semiconductor so that a junction is formed between each doped region and the substrate.

4. The apparatus of claim 1 wherein each of the N electrodes and the substrate forms a separate junction.

5. The apparatus of claim 1 wherein the insulating layer means comprises an oxide layer and a superionic conductor layer, one of said layers overlaying the other of said layers.

6. The apparatus of claim 1 wherein the adjacent semiconductor stripe regions are spaced from each other by grooves formed by the insulating layer means extending into the second face between adjacent one of the doped regions.

7. The apparatus of claim 6 wherein the substrate is a lightly doped semiconductor so that a junction is formed between each doped region and the substrate.

8. The apparatus of claim 6 wherein each of the N electrodes and the substrate forms a separate junction.

9. The apparatus of claim 6 wherein the insulating layer means comprises an oxide layer and a superionic conductor layer, one of said layers overlaying the other of said layers.

10. The apparatus of claim 1 wherein the N electrodes extend in the X direction, the M electrodes and M semiconductor regions extend in the Y direction.

11. The apparatus of claim 1 further including means for cyclically modulating the image incident on the M semiconductor stripes.

12. The apparatus of claim 1 further including electric excitation source means, electric load means, first means for connecting a first terminal of one of said electric means to the N electrodes, second means for connecting a first terminal of the other of said electric means to the M electrodes, second terminals of said electric means being connected together.

13. The apparatus of claim 12 wherein the excitation source means is AC and the electric load means includes spectrum analyzer means for measuring the amplitude of Fourier components supplied to the electric load means by the electrodes connected to the electric load means.

14. The apparatus of claim 13 wherein the AC excitation source means includes a plurality of frequencies such that a different frequency is simultaneously applied by the AC excitation source means to a different one of the electrodes connected to the source means.

15. The apparatus of claim 12 wherein the first connecting means includes a switch for sequentially connecting said first terminal of said one electric means to the N electrodes, the second connecting means including a switch for sequentially connecting said first terminal of said other electric means to the M electrodes.

16. A photocapacitive image detector array comprising a semiconductor substrate having a relatively low carrier concentration, a matrix of M×N spaced doped columns of relatively high carrier concentration extending through the substrate between first and second opposite faces thereof, N parallel spaced electrode stripes extending in the X direction on the first face, stripe k of the N stripes making ohmic contact with each of columns 1, 2, . . . M, where k=1, 2, . . . N, M parallel spaced semiconductor stripes of intermediate carrier concentration extending in the Y direction on the second face, stripe p of the M semiconductor stripes making contact with each of columns 1, 2, . . . N, where p=1, 2, . . . M, each of the M regions having a depletion layer having a thickness adapted to be modulated by radiation from the image to be detected, M parallel spaced electrode stripes extending in the Y direction so that stripe q of electrode stripes M is in registration with semiconductor stripe q, where q=1, 2, . . . M, and N and M are integers greater than one, insulating layer means sandwiched between the M electrode stripes and the M semiconductor stripes, the insulating layer means and M electrodes being transparent to radiation from the image so that the image is incident on the semiconductor stripes to modulate the thickness of the depletion layers of the semiconductor stripes, whereby M×N pixels are formed, each pixel being associated with a different one of said columns.

17. The apparatus of claim 16 wherein the substrate is a lightly doped semiconductor so that a junction is formed between each doped column and the substrate.

18. The apparatus of claim 16 wherein each of the N electrodes and the substrate forms a separate junction.

19. The apparatus of claim 16 wherein the insulating layer means comprises an oxide layer and a superionic conductor layer, one of said layers overlaying the other of said layers.

20. The apparatus of claim 16 wherein the adjacent semiconductor stripe regions are spaced from each other by grooves formed by the insulating layer means extending into the second face between adjacent one of the doped regions.

21. The apparatus of claim 20 wherein the insulating layer means comprises an oxide layer and a superionic conductor layer, one of said layers overlaying the other of said layers.

22. The apparatus of claim 21 wherein the substrate is a lightly doped semiconductor so that a junction is formed between each doped region and the substrate.

23. The apparatus of claim 22 wherein each of the N electrodes and the substrate forms a separate junction.

24. A photocapacitor detector comprising a semiconductor substrate having a relatively low carrier concentration, a doped column of relatively high carrier concentration extending through the substrate between first and second opposite faces of the substrate, a first electrode on the first face making ohmic contact with the doped column, a semiconductor layer of intermediate carrier concentration on the second face making contact with the column, the semiconductor layer having a depletion layer having a thickness adapted to be modulated by radiation to be detected, insulator layer means overlaying the semiconductor layer, and a second electrode overlaying the insulator layer means in registration with the column and semiconductor layer, the insulating layer and second electrode being transparent to radiation to be detected so that the radiation to be detected is incident on the semiconductor layer to modulate the thickness of the depletion layer.

25. A photocapacitive image detector array comprising a semiconductor substrate having a relatively low carrier concentration as well as opposite first and second faces, N mutually spaced parallel stripe electrodes extending in a first direction along said first face of the substrate, M mutually spaced parallel stripe semiconductor regions of intermediate carrier concentration extending in a second direction along said second face of the substrate, each of the M regions including a depletion layer having a thickness adapted to be modulated by an image to be detected, the first and second directions differing from each other, the insulating layer means covering the M semiconductor stripe regions and separating adjacent ones of the semiconductor stripe regions from each other, M mutually spaced parallel stripe electrodes extending in the second direction so that the electrode k of the M electrodes overlays the insulating layer means covering semiconductor stripe region k, where k=1,2 . . . M, the insulating layer means and M electrodes being transparent to radiation from the image so that the image is incident on the M semiconductor stripes, photocapacitive pixels being formed by the N electrodes making contact with the plural doped regions contacting the semiconductor stripe regions which are covered by the insulating layer means which in turn are overlaid by the M electrodes; the adjacent semiconductor stripe regions being spaced from each other by grooves formed by the insulating layer means extending into the second face between adjacent one of the doped regions.

26. The apparatus of claim 25 wherein the insulating layer means comprises an oxide layer and a superionic conductor layer, one of said layers overlaying the other of said layers.

27. The apparatus of claim 26 wherein each of the N electrodes and the substrate forms a separate junction.

28. The apparatus of claim 25 wherein each of the N electrodes and the substrate forms a separate junction.

* * * * *